United States Patent
Ikeda et al.

(10) Patent No.: US 6,407,011 B1
(45) Date of Patent: Jun. 18, 2002

(54) LOW DIELECTRIC CONSTANT INSULATING FILMS WITH LAMINATED CARBON-CONTAINING SILICON OXIDE AND ORGANIC LAYERS

(75) Inventors: Koichi Ikeda; Masanaga Fukasawa; Hideyuki Kito; Toshiaki Hasegawa, all of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/626,397

(22) Filed: Jul. 26, 2000

(30) Foreign Application Priority Data

Jul. 27, 1999 (JP) .......................................... 11-211501

(51) Int. Cl.⁷ .............................................. H01L 21/31
(52) U.S. Cl. ....................... 438/786; 438/624; 438/763; 438/782; 257/760; 427/397.7; 428/688
(58) Field of Search ................................. 438/786, 780, 438/763, 623, 624, 782; 257/759, 760; 427/397.7; 428/688

(56) References Cited

U.S. PATENT DOCUMENTS

| 5,534,731 | A | * | 7/1996 | Cheung |
| 5,641,559 | A | * | 6/1997 | Namiki |
| 5,989,998 | A | * | 11/1999 | Sugahara et al. |
| 6,071,807 | A | * | 6/2000 | Watanabe et al. |
| 6,114,259 | A | * | 9/2000 | Sukharev et al. |
| 6,127,258 | A | * | 10/2000 | Watanabe et al. |
| 6,232,235 | B1 | * | 5/2001 | Cave et al. |
| 6,303,047 | B1 | * | 10/2001 | Aronowitz et al. ............ 252/1 |
| 6,331,494 | B1 | * | 12/2001 | Olson et al. ................ 438/770 |

FOREIGN PATENT DOCUMENTS

WO    WO 99/19229    * 4/1999

* cited by examiner

Primary Examiner—Olik Chaudhuri
Assistant Examiner—Stephen W. Smoot
(74) Attorney, Agent, or Firm—Rader, Fishman & Grauer PLLC; Ronald P. Kananen (57) ABSTRACT

A stacked insulating film having an organic insulating film, and a carbon-containing silicon oxide film formed on the organic insulating film is disclosed. The carbon-containing silicon oxide film has a carbon content of 8 atom % to 25 atom %.

11 Claims, 7 Drawing Sheets

LOW DIELECTRIC CONSTANT INSULATING FILMS WITH LAMINATED CARBON-CONTAINING SILICON OXIDE AND ORGANIC LAYERS

BACKGROUND OF THE INVENTION

1. Field of the Invention

The present invention relates to methods of forming stacked insulating films and of fabricating semiconductor devices, and more particularly, to stacked insulating films, methods for forming thereof, semiconductor devices using such stacked insulating film as an interlayer insulating film, and methods for fabricating such semiconductor devices.

2. Description of the Related Art

As a degree of integration of recent semiconductor integrated circuits advances, there is an increasing need for using a low-k film (a dielectric film having a low dielectric constant) as an insulating film aiming at faster operation speed and lower electric consumption of LSIs. An approach using an organic insulating film as the low-k film, in place of a silicon oxide film which has been a former standard of the interlayer insulating film, was reported, for example, by Hasegawa et al. in the Proceedings of 1997 Dry Process Symposium. The organic insulating film reported in the literature employed an organic polymer containing no silicon as a component element.

In the general procedures, such organic insulating film is processed using a process mask made of a silicon oxide film. Fukazawa et al. reported in the Proceedings of 1998 Dry Process Symposium an exemplary process based on dry etching using oxygen or nitrogen gas plasma. The silicon oxide film used as a process mask remains unremoved and serves as a part of a material composing a finished semiconductor device. The silicon oxide film can generally be processed with a fluorine-containing gas which hardly etches the organic insulating film. This ensures a status of so-called high process selectivity, which has been desirable in terms of designing semiconductor fabrication processes.

The silicon oxide film is generally formed by the plasma CVD (chemical vapor deposition) process, since the process temperature has to be suppressed at 400° C. or below so as not to affect the wirings already formed. Typical conditions for the film formation employ monosilane ($SiH_4$) with a flow rate of 100 sccm, nitrous oxide ($N_2O$) with a flow rate of 2,000 sccm, and nitrogen ($N_2$) with a flow rate of 1,000 sccm, all of which being introduced into a reaction chamber of a plasma CVD apparatus, and a microwave power of 350 W (2.45 GHz) and a substrate susceptor temperature of 400° C.

However, a problem resides in that the interlayer insulating film made of an organic material may be highly combustible. Such organic insulating film can easily be processed with an oxygen-base gas, whereas it is very likely to get oxidation damage. Even in a process using nitrogen gas, the organic insulating film to be processed may easily get damage due to degassing components released from the neighboring oxide films. Although this may not result in combusting-out of the organic insulating film as in a process known as ashing, an oxidative decomposition reaction may proceed within the film, and volatile hydrocarbons (or oxygen-containing hydrocarbons) may be emitted. It is on such organic insulating film that the silicon oxide is stacked.

In the process of forming the silicon oxide film for covering wirings in LSIs, the plasma CVD process, is generally employed considering limitations on the film forming temperature and on the productivity. The reactive gas used in the plasma CVD process for forming the silicon oxide film, however, contains an oxidizing agent. For example, nitrous oxide is typically used as the oxidizing agent when silane gas is used as a silicon source, and oxygen is generally used for the case with tetraethoxysilane (TEOS).

After the silicon oxide film is formed to a certain thickness on the organic insulating film, the silicon oxide film per se becomes resistive enough to prevent the surface of the organic insulating film from direct attack by the oxygen gas plasma. Some fear of oxidative combustion reaction on the surface of the organic insulating film, however, still remains in the early stage of the film formation. While various approaches have been made to suppress the oxidative combustion reaction in the early stage of the film formation through controlling conditions of applying a microwave or a timing of the gas supply, they are still on the way to thorough suppression.

Figure 7A:
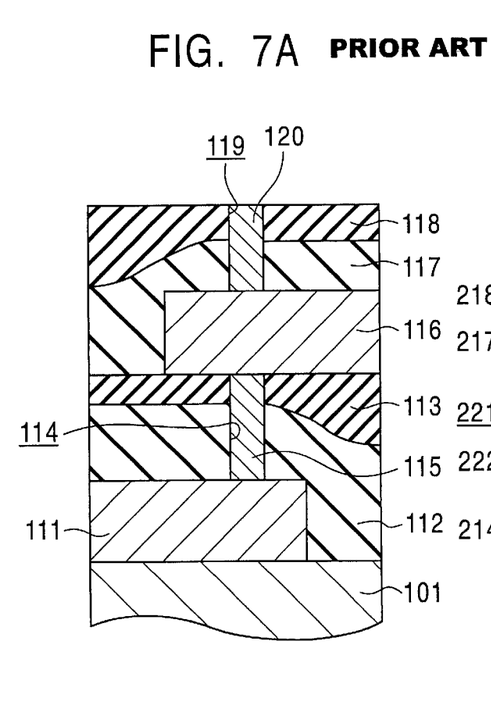
FIGS. 7A and 7B are schematic sectional views for explaining conventional problems.

FIG. 7A shows an exemplary conventional aluminum wiring as combined with tungsten via plugs, in which a first wiring 111 is fabricated on a substrate 101, a first organic insulating film 112 is formed so as to cover the first wiring 111, and further thereon a first silicon oxide film 113 is formed. A first contact hole 114 is provided so as to penetrate the first silicon oxide film 113 and the first organic insulating film 112 and so as to reach the first wiring 111, and the first contact hole 114 is filled with a first plug 115 made of tungsten.

On the first silicon oxide film 113 formed is a second wiring 116, which is covered with a second organic insulating film 117, and further thereon a second silicon oxide film 118 is formed. A second contact hole 119 is provided so as to penetrate the second silicon oxide film 118 and the second organic insulating film 117 and so as to reach the second wiring 116, and the second contact hole 119 is filled with a second plug 120 made of tungsten.

Figure 7B:
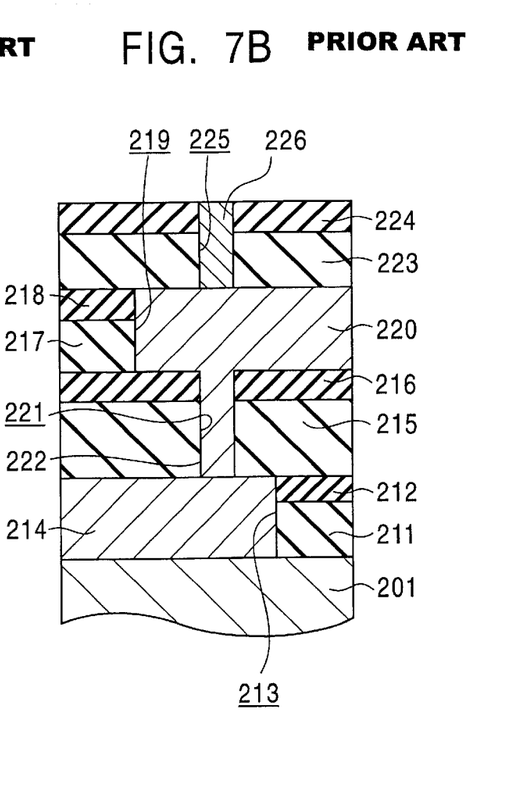

FIG. 7B shows an exemplary copper damascene wiring, in which a first organic insulating film 211 is formed on a substrate 201, and further there on a first silicon oxide film 212 is formed. A first groove 213 is provided to the first silicon oxide film 212 and the first organic insulating film 211, and a first wiring 214 is formed so as to fill the first groove 213. On the first silicon oxide film 212, formed are a second organic insulating film 215 covering a first wiring 214; a second silicon oxide film 216; a third organic insulating film 217; and a third silicon oxide film 218 in this order.

A second groove 219 is provided to the third silicon oxide film 218 and the third organic insulating film 217, and a second wiring 220 is formed so as to fill the second groove 219. A first contact hole 221 is provided so as to penetrate the second silicon oxide film 216 and the second organic insulating film 215, and a first plug 222 is formed so as to fill the first contact hole 221 and so as to interconnect the second wiring 220 and the first wiring 214.

Further on the third silicon oxide film 218, a fourth organic insulating film 223 and a fourth silicon oxide film 224 are stacked in this order so as to cover the second wiring 220. A second contact hole 225 is provided so as to penetrate the fourth silicon oxide film 224 and the fourth organic insulating film 223 and so as to reach the second wiring 220, and a second plug 226 is formed so as to fill the second contact hole 225.

In both wiring configurations shown in FIGS. 7A and 7B, the individual organic insulating films may introduce damages in their interfacial area with the adjacent silicon oxide films when the silicon oxide films are directly formed on the organic insulating films.

Worse than all, even if the organic insulating films shown in the individual configurations in FIGS. 7A and 7B are made with, for example, polyaryl ether, which is expected to lower the overall dielectric constant of the insulating films due to its small dielectric constant of approx. 2.7, the effect of using such low-k film will partially be cancelled by using the silicon oxide films having a dielectric constant as high as 4.2. Hence, depending on the ratio of their film thicknesses, an effective dielectric constant of the stacked insulating film as contributed by the organic insulating films and the silicon oxide films will exceed 3.0. This may result in insufficient reduction in inter-wiring capacitance occurring between the neighboring wirings in the different layers or in the same layer, and thus may adversely affect performances of semiconductor devices such as signal transmission delay.

SUMMARY OF THE INVENTION

It is therefore an object of the present invention to provide stacked insulating films, methods for forming thereof, semiconductor devices using such stacked insulating film, and methods for fabricating such semiconductor devices.

A stacked insulating film of the present invention comprises an organic insulating film and a carbon-containing silicon oxide film formed thereon, in which the carbon-containing silicon oxide film has a carbon content of 8 atom % to 25 atom %.

As for the above stacked insulating film, the carbon-containing silicon oxide film formed on the organic insulating film serves as an etching mask when the organic insulating film is etched. The silicon oxide film with a carbon content of 8 atom % to 25 atom % has a dielectric constant of as low as approx. 2.0 to 3.0, which is smaller than that of silicon oxide films free from carbon or other impurities. Thus an effective dielectric constant of the stacked insulating film as contributed both by the organic insulating film and the carbon-containing silicon oxide film will be suppressed to 3.0 or below, thereby to provide the low-k insulating film.

A carbon content in the carbon-containing silicon oxide film exceeding 25 atom % may degrade the inorganic properties thereof and on the contrary enhance organic properties. In particular, a carbon content exceeding 30 atom % will almost ruin the inorganic properties of the carbon-containing silicon oxide film and yield organic properties instead. Such carbon-containing silicon oxide film will thus have an etching property similar to that of the organic insulating film lying thereunder, and can no longer play a role of an etching mask for the organic insulating film. On the contrary, a carbon content of the carbon-containing silicon oxide film less than 8 atom % may result in a high dielectric constant almost equivalent or similar to that of a carbon-free silicon oxide film, which is unsuccessful in fully obtaining effects of the carbon addition.

A method for forming a stacked insulating film of the present invention comprises a step for forming on a substrate an organic insulating film, and a step for forming by coating on the organic insulating film a carbon-containing silicon oxide film, in which the carbon-containing silicon oxide film is formed so as to attain a carbon content of 8 atom % to 25 atom %.

Such method for forming the stacked insulating film in which the carbon-containing silicon oxide film is formed by coating allows so-called low temperature film formation, and successfully avoids damages on the surface of the organic insulating film during the formation of the carbon-containing silicon oxide film since no plasma exposure nor sputtering action is involved. It also becomes proper to use the carbon-containing silicon oxide film as an etching mask when the organic insulating film is etched. Since the carbon-containing silicon oxide film is formed so as to attain a carbon content of 8 atom % to 25 atom %, the film will have a dielectric constant of as low as approx. 2.0 to 3.0, which is lower than that of a pure silicon oxide film. An effective dielectric constant of the stacked insulating film as contributed both by the organic insulating film and the carbon-containing silicon oxide film will be 3.0 or below, and thus the low-k stacked insulating film can be obtained. The reason why the carbon content is defined as above is similar to that described in the previous paragraph.

A semiconductor device of the present invention has an insulating film at least a part of which comprises a stacked insulating film, and such stacked insulating film has an organic insulating film and a carbon-containing silicon oxide film formed thereon, in which the carbon-containing silicon oxide film has a carbon content of 8 atom % to 25 atom %.

The semiconductor device has an insulating film at least a part of which comprises a stacked insulating film consisting of an organic insulating film and a carbon-containing silicon oxide film formed thereon, and the stacked insulating film has an effective dielectric constant lower than that of the conventional stacked insulating film consisting of an organic insulating film and a pure silicon oxide film (dielectric constant=4.2) free from impurities such as carbon. This is because silicon oxide film can reduce its dielectric constant by incorporating carbon, so that the above carbon-containing silicon oxide film can have a dielectric constant lower than that of silicon oxide film containing no impurity.

The carbon-containing silicon oxide film has a carbon content of 8 atom % to 25 atom % and, as a result, has a dielectric constant of approx. 2.0 to 3.0, which may vary depending on the carbon content. A dielectric constant of the organic insulating film is 3.0 or below in general. Thus the effective dielectric constant of the stacked insulating film as contributed by the organic insulating film and the carbon-containing silicon oxide film will be 3.0 or below, and thereby the low-k stacked insulating film can be composed. Using such stacked insulating film for isolating wirings in the different layers or within the same layer will successfully reduce the inter-wiring capacitance occurring between the neighboring wirings in separate layers or in the same layer, and will improve performances of semiconductor devices such as avoiding signal transmission delay. The reason why the carbon content is defined as above is similar to that described in the previous paragraph.

While the carbon-containing silicon oxide film, after being used as an etching mask for masking the organic insulating film, remains to be used as a part of the insulating film of semiconductor devices, the carbon-containing silicon oxide film will not adversely affect the lower dielectric strategy since the effective dielectric constant of the stacked insulating film will be regulated at 3.0 or below. This may increase the process margin in the forming process of the interlayer insulating film of semiconductor devices.

A method for fabricating a semiconductor device of the present invention comprises a step for forming on a substrate an organic insulating film, and a step for forming by coating on the organic insulating film a carbon-containing silicon oxide film, in which the carbon-containing silicon oxide film is formed by coating an organic spin-on-glass solution, and the carbon-containing silicon oxide film is formed so as to attain a carbon content of 8 atom % to 25 atom %.

Such method for fabricating a semiconductor device allows so-called low temperature film formation of the carbon-containing silicon oxide film since the film is formed by coating on the organic insulating film. It is also beneficial that the surface of the organic insulating film can exempt from process-related damages and thus ensure a good adhesiveness of the stacked insulating film, since no plasma irradiation nor sputtering action is exerted on the surface. For the case that the carbon-containing silicon oxide film is formed by coating an organic SOG (spin-on-glass) solution, the carbon content within the carbon-containing silicon oxide film can appropriately be adjustable according to structures and amount of carbon-containing groups in the organic SOG solution. For example, it is adjustable by substituting methyl groups with ethyl groups, or by altering the amount of alkyl groups. Thus the carbon-containing silicon oxide film can be formed with a desired carbon content.

Such carbon-containing silicon oxide film still retains inorganic properties, so that it can be useful as an etching mask when the organic insulating film is etched. Since the carbon-containing silicon oxide film is formed so as to attain a carbon content of 8 atom % to 25 atom %, the film will have a dielectric constant of as low as approx. 2.0 to 3.0, which is lower than that of a pure silicon oxide film. An effective dielectric constant of the stacked insulating film as contributed both by the organic insulating film and the carbon-containing silicon oxide film will be 3.0 or below, and thus the low-k stacked insulating film can be obtained. The reason why the carbon content is defined as above is similar to that described in the previous paragraph.

DESCRIPTION OF THE PREFERRED EMBODIMENTS

A preferred embodiment of the stacked insulating film and the method for forming thereof according to the present invention will be detailed hereinafter referring to FIG. 1.

Figure 1:
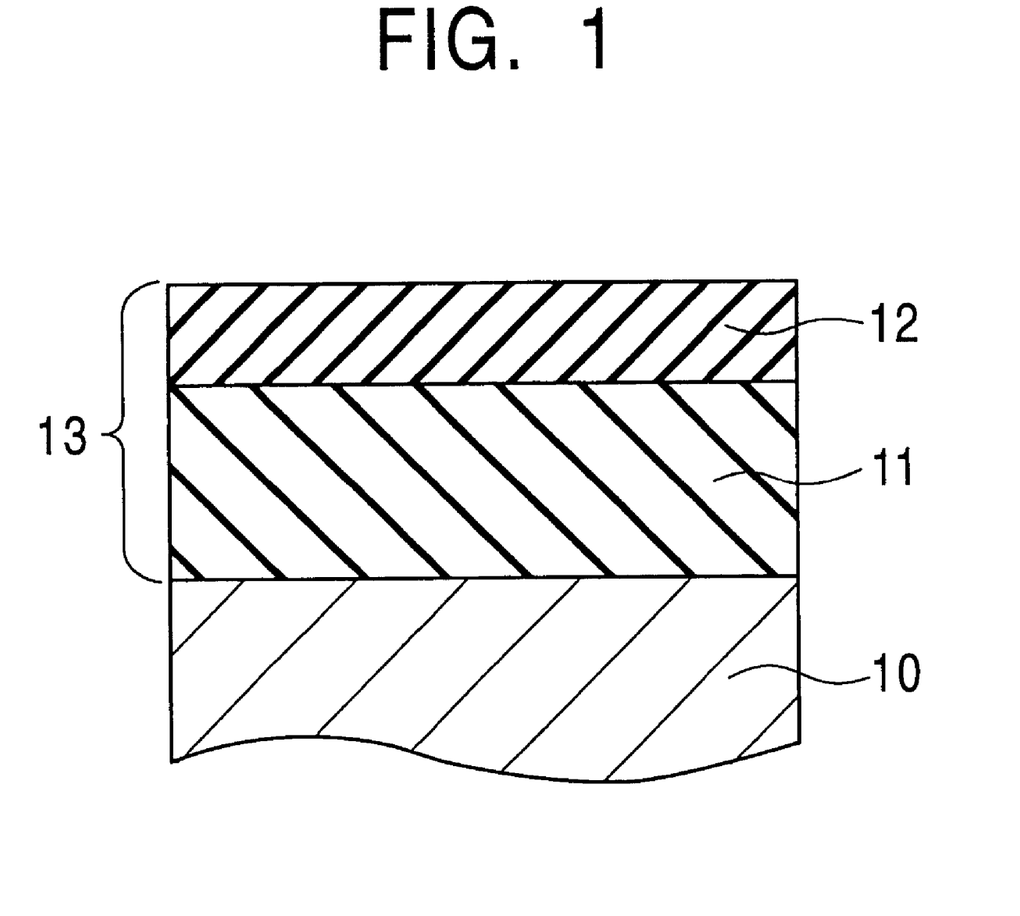
FIG. 1 is a schematic sectional view showing an exemplary embodiment of the stacked insulating film and the method for forming thereof of the present invention.

As shown in FIG. 1, an organic insulating film 11 is formed on a substrate 10. The organic insulating film 11 is made of, for example, a polyaryl ether film with a dielectric constant of 2.75. The polyaryl ether is generally expressed by a structural formula (1), and commercially available examples thereof include FLARE, SILK and VELOX (all being the trade names).

[Formula 1]

(where, Ar and Ar' represent aromatic groups)

On the organic insulating film 11, a carbon-containing silicon oxide film 12 is formed. The carbon-containing silicon oxide film 12 is a silicon oxide film retaining inorganic properties while containing carbon in an amount of 8 atom % to 25 atom %, more preferably 10 atom % to 20 atom %, and is preferably formed by the coating process. In this embodiment, typically used was a carbon-containing silicon oxide film with a carbon content of 20 atom % and a dielectric constant of 2.70. Thus a stacked insulating film 13 is composed with the organic insulating film 11 and the carbon-containing silicon oxide film 12.

Now the organic insulating film 11 is by no means limited to the polyaryl ether film and can be selected from those made of arbitrary organic insulating materials provided that they have a dielectric constant of 3.0 or below. Examples of possible materials therefor include cyclic fluorocarbon resin-siloxane copolymer, polytetrafluoroethylene (PTFE), amorphous PTFE (e.g., Teflon AF: trade name), cyclo polymerized fluorinated polymer (e.g., Cytop: trade name), fluorinated polyimide, polyimide and benzocyclobutene (BCB).

Figure 2:
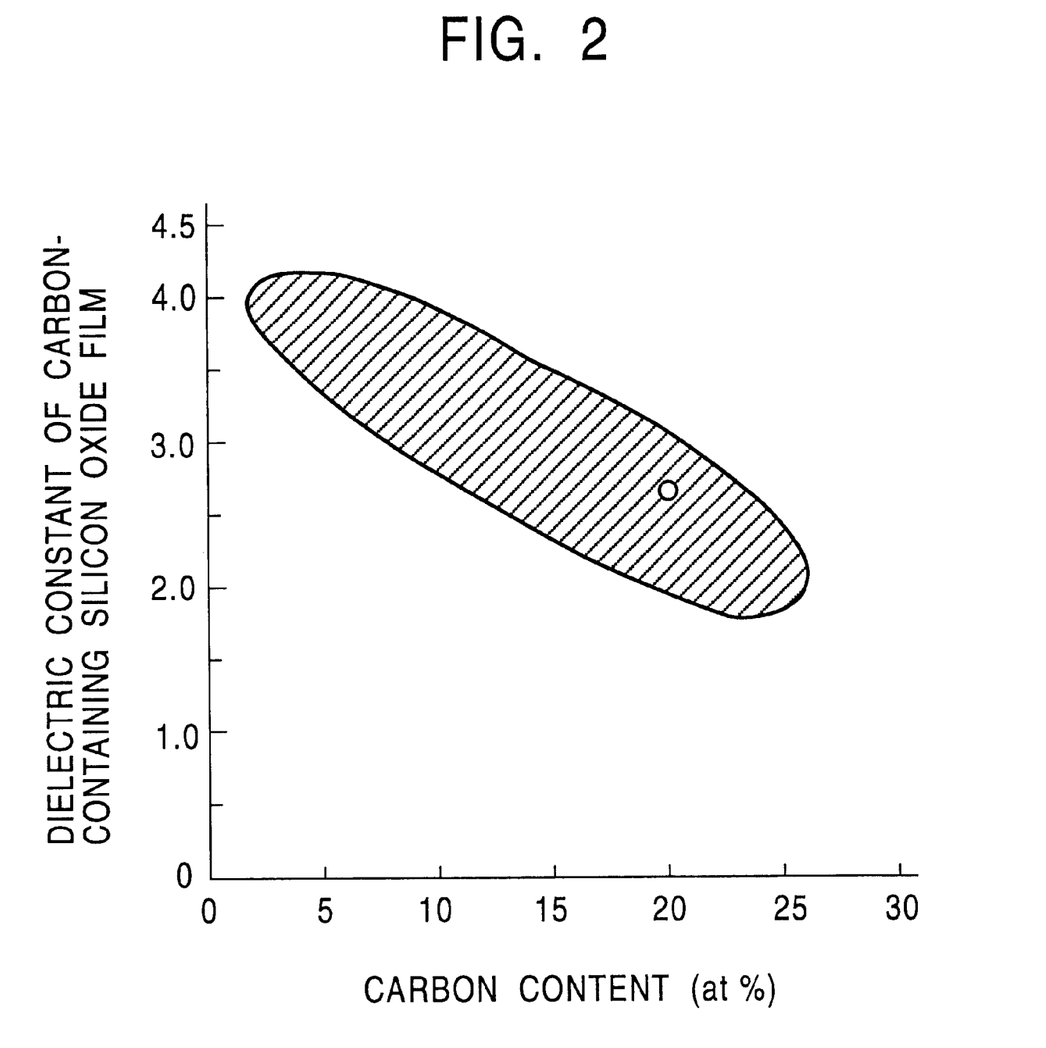
FIG. 2 is a chart showing a relation between a certain range of the carbon content and dielectric constant of the carbon-containing silicon oxide film.

Next, a preferable range of the carbon content of the carbon-containing silicon oxide film 12 is described referring to FIG. 2. In FIG. 2, the ordinate denotes the dielectric constant of the carbon-containing silicon oxide film and the abscissa denotes the carbon content.

As indicated by the hatched area in FIG. 2, the dielectric constant tends to decrease as the carbon content in the carbon-containing silicon oxide film increases. A typical carbon-containing silicon oxide film 12 was found to have a dielectric constant of 2.70 at a carbon content of 20 atom % as indicated with an open circle. The reason why the relation between the carbon content and dielectric constant is expressed with a certain range is that even silicon oxide films containing an equal amount of carbon can exhibit different dielectric constants depending on their densities. While depending on the film density, at least 8 atom % or more of carbon content is required to reduce the dielectric constant to 3.0 or below. On the other hand, the carbon content must be controlled at 25 atom % at most so as to make carbon-containing silicon oxide film 12 retain inorganic properties.

Of such stacked insulating film 13 consisting of the inorganic insulating film 11 and the carbon-containing silicon oxide film 12 formed thereon, the carbon-containing silicon oxide film 12 can serve as an etching mask due to its inorganic properties when the organic insulating film 11 is etched.

The carbon-containing silicon oxide film 12 with a carbon content of 8 atom % to 25 atom % has a dielectric constant of, for example, approx. 2.0 to 3.0, which is lower than that of an impurity-free silicon oxide film. Thus an effective dielectric constant of the stacked insulating film 13 as contributed both by the organic insulating film 11 and the carbon-containing silicon oxide film 12 will be suppressed to 3.0 or below, and thereby the low-k insulating film can be provided.

A carbon content in the carbon-containing silicon oxide film 12 exceeding 25 atom % may degrade the inorganic properties thereof and on the contrary enhance organic properties. In particular, a carbon content exceeding 30 atom % will almost ruin the inorganic properties of the carbon-containing silicon oxide film 12 and yield organic properties instead. Such carbon-containing silicon oxide film 12 will thus have an etching property similar to that of the organic insulating film 11 lying thereunder, and can no longer play a role of an etching mask for the organic insulating film 11. On the contrary, a carbon content of the carbon-containing silicon oxide film 12 less than 8 atom % may result in a high dielectric constant almost equivalent or similar to that of a carbon-free silicon oxide film, which is unsuccessful in fully obtaining effects of the carbon addition. Based on these facts, the carbon content of the carbon-containing silicon oxide film 12 was defined within a range from 8 atom % to 25 atom % as described above.

Such stacked insulating film 13 was formed as described below. First, a polyaryl ether film was formed as the organic insulating film 11 on the substrate 10. The polyaryl ether film was formed by spin-coating a polyaryl ether precursor, which was followed by curing at 300° C. to 450° C.

For the case that the organic insulating film 11 is formed with a fluorocarbon resin, the film maybe formed by chemical vapor deposition (abbreviated hereinafter as CVD) and curing at 300° C. to 450° C., while the coating method as described above-also being applicable. As for the CVD process, examples of available fluorocarbon gas include octafluorobutene ($C_4F_8$) and tetrafluoroethylene ($C_2F_4$), which may be added with acetylene ($C_2H_2$) or ethylene ($C_2H_4$) for improving heat resistance of the obtained film. Typical CVD conditions relate to a source power for plasma excitation of 500 W (13.56 MHz), a flow rate of octafluorobutene of 100 sccm, a flow rate of ethylene of 200 sccm, a pressure in film forming environment of 27 Pa to 667 Pa, and a substrate temperature of 150° C. to 350° C.

Next, the carbon-containing silicon oxide film 12 was formed by coating on the organic insulating film 11. A typical coating process is such that dropping an organic SOG solution onto the organic insulating film 11 formed on the substrate 10 kept under rotation at 3,000 rpm, and making the solution spread over the entire surface by centrifugal force, thereby to form a coated film of organic SOG in a predetermined thickness. The coated film was then baked at 150° C. to 200° C., and then cured at around 350° C. to 450° C. for approx 30 minutes to one hour. Thus the carbon-containing silicon oxide film 12 was formed on the organic insulating film 11 on the substrate 10. MSQ (Methyl silsesquioxane) as expressed by the formula (2) was typically used as the organic SOG solution.

[Formula 2]

(2)

The carbon content of the carbon-containing silicon oxide film 12 is adjustable by selecting the quantity of the methyl groups bound to silsesquioxane chain. Based on such technique, the carbon content of the carbon-containing silicon oxide film 12 is adjusted within a range from 8 atom % to 25 atom %, thereby to attain a dielectric constant of 3.0 or below while preserving the inorganic properties, and in particular preserving etching property specific to an inorganic film beneficial enough as an etching mask for the organic insulating film.

The foregoing method for forming the stacked insulating film is also advantageous for allowing so-called low temperature film formation since the carbon-containing silicon oxide film 12 is formed by coating on the organic insulating film 11. Moreover, the surface of the organic insulating film 11 can exempt from process-related damages since no plasma irradiation nor sputtering action is exerted on the surface. The carbon-containing silicon oxide film 12 can be available as an etching mask when the organic insulating film 11 is etched.

Since the carbon-containing silicon oxide film 12 is formed so as to attain a carbon content of 8 atom % to 25 atom %, the film 12 can have a dielectric constant of, for example, approx. 3.0, which is smaller than that of the pure silicon oxide film. Thus an effective dielectric constant of the stacked insulating film 13 as contributed both by the organic insulating film 11 and the carbon-containing silicon oxide film 12 will be suppressed to 3.0 or below, thereby to provide the low-k insulating film. The reason why the carbon content is defined as above is similar to that described in the previous paragraph.

Figure 3A:
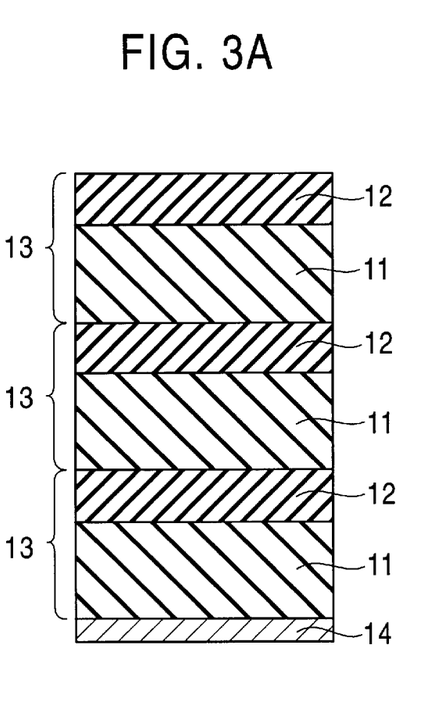
FIGS. 3A and 3B are schematic sectional views showing exemplary configurations of the stacked insulating film of the present invention.

The stacked insulating film 13 explained referring to FIG. 1 may be formed in plural layers as shown in FIG. 3A. FIG. 3A shows a case with triple stacked insulating films 13 consecutively formed on a silicon nitrite film 14, each stacked insulating film 13 consisting of the organic insulating film 11 and the carbon-containing silicon oxide film 12, while double consecutive structure or quadruple or more consecutive structure is also permissible.

Figure 3B:
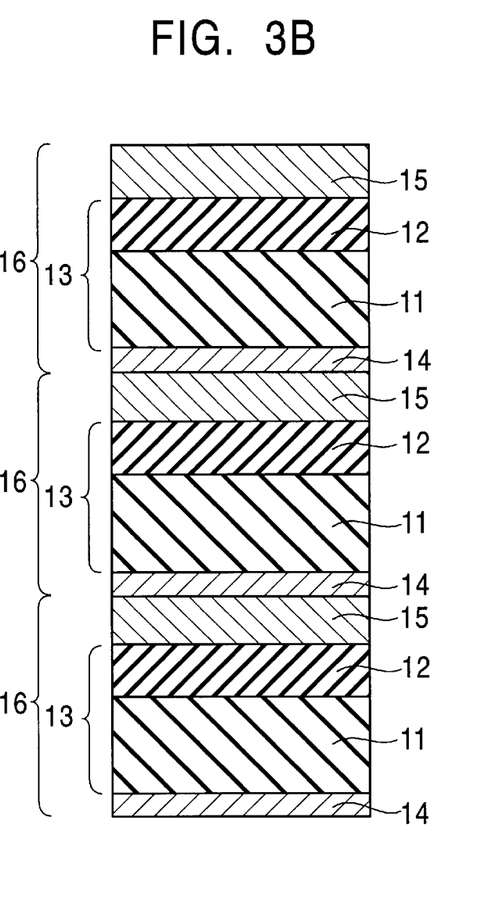

Another possible case as shown in FIG. 3B has the stacked insulating film 13 as a part of an insulating film having a larger stacked structure. FIG. 3B shows a case with stacked films 16 in a triple consecution, each stacked film 16 having the silicon nitrite film 14, the stacked insulating film 13 consisting of the organic insulating film 11 and the carbon-containing silicon oxide film 12, and a plasma CVD oxide film 15 stacked in this order. The stacked film 16 in a double or quadruple or more consecution is also allowable.

The stacked insulating film 13 can be used as an insulating film between wirings within the same layer or in adjacent layers. It was confirmed that the dielectric constant of the carbon-containing silicon oxide film 12 was successfully reduced to 2.8 from the conventional value (=4.2) of the silicon oxide film, which was ascribable to the incorporation of carbon. The present inventors also confirmed that the conventional problem in rise in dielectric constant due to use of the silicon oxide film was resolved, and that an effective dielectric constant could be reduced to 3.0 or below by simply replacing the conventional silicon oxide film with the carbon-containing silicon oxide film 12.

Next a method for forming the carbon-containing silicon oxide film was investigated. In the embodiment of the present invention, the film was formed by the coating process. The carbon-containing silicon oxide film was also formed by the plasma CVD process for comparison.

In the embodiment of the present invention, the organic insulating film 11 was formed on the substrate 10, then an organic SOG solution was dropped onto the organic insulating film 11 formed on the substrate 10 kept under rotation at 3,000 rpm, and was spread over the entire surface by centrifugal force, thereby to form a thin SOG film. The SOG film was then baked and cured to be converted into the carbon-containing silicon oxide film 12. The baking typically proceeded at 150° C. to 200° C., and the curing at 350° C. to 450° C. for approx. 30 minutes to 60 minutes.

For comparison, the carbon-containing silicon oxide film was also formed by the plasma CVD process. For example, a mixed gas of monosilane ($SiH_4$), nitrous oxide ($N_2O$) and nitrogen ($N_2$), which has been used for depositing the impurity-free silicon oxide film as described above, was further mixed with ethane ($C_2H_6$) to obtain the carbon-containing silicon oxide film. The carbon content was adjusted by controlling the amount of addition of ethane ($C_2H_6$). Other conditions for the film formation relate to an applied microwave power of 350 W (2.45 GHz) and a substrate susceptor temperature of 400° C.

In the deposition of the carbon-containing silicon oxide by such plasma CVD process, the surface of the organic insulating film was exposed to the oxidative gas plasma, which undesirably decomposed the organic insulating film, and also degraded film properties of the initially grown portion of the carbon-containing silicon oxide film. On the contrary, the coating process caused no deteriorative change in the surface property of the organic insulating film, which resulted in a successful film formation.

Next, etching depth dependence of the etching rates of the silicon oxide films was investigated for two cases; in one case the etching rate being observed for etching, using a diluted hydrofluoric acid solution, of a silicon oxide film free from carbon or other impurities formed on the organic insulating film (e.g., polyaryl ether film) by the plasma CVD process; and in another case the other etching rate being observed for the similar etching of a carbon-containing silicon oxide film formed by the coating process. The results were shown in FIG. 4, in which the ordinate denotes the etching rate, the abscissa denotes the thicknesses of the residual silicon oxide films on the organic insulating film, and the position of zero denotes the interface with the organic insulating film.

Figure 4:
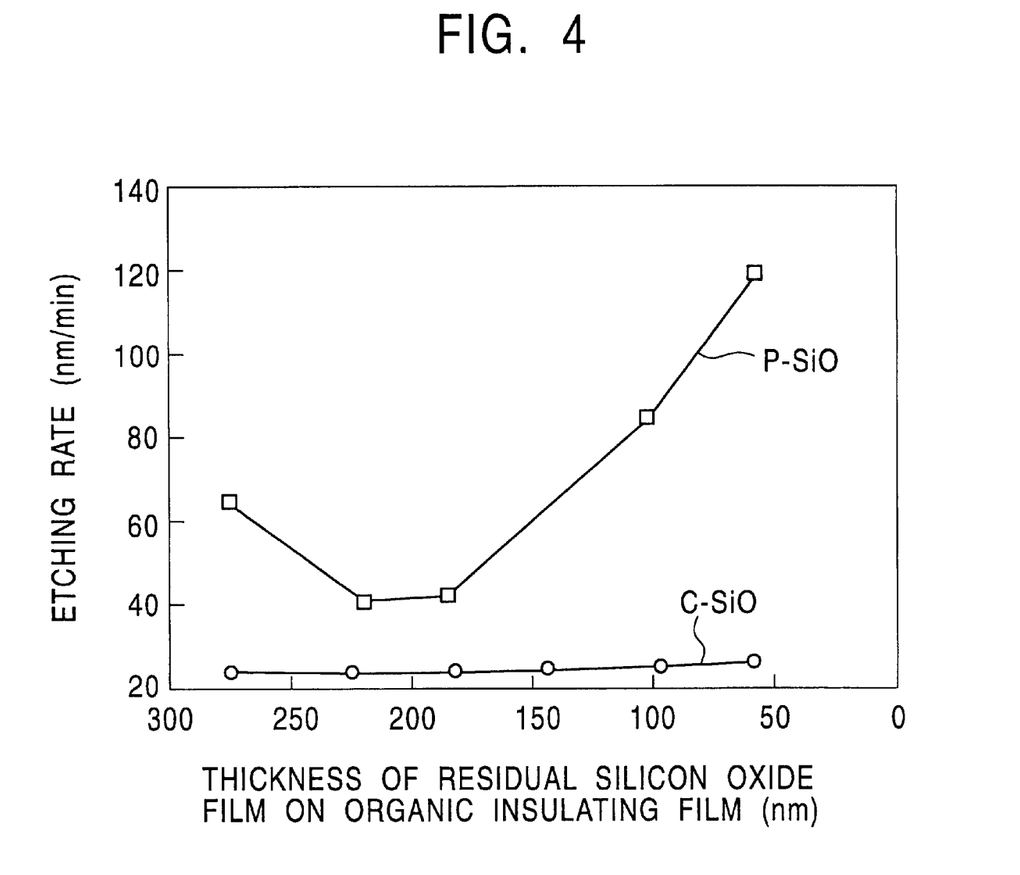
FIG. 4 is a chart for explaining etching depth dependence of the etching rate of the silicon oxide films as expressed by relations between the etching rates of the silicon oxide films and thicknesses of the residual silicon oxide films on the organic insulating film.

As is clear from FIG. 4, the silicon oxide film formed by the plasma CVD process (P—SiO; plotted with open squares) was etched faster as the etching front approached the interface with the organic insulating film, which was an indication of degraded film properties. This means that damages produced in the organic insulating film adversely affected the early stage of the formation the silicon oxide film. On the other hand, the carbon-containing silicon oxide film formed by the coating process (C—SiO; plotted with open circles) was found to show almost no change in the etching rate even when the etching front approached the interface with the organic insulating film. This is because no damage was produced in the organic insulating film in the coating process, and thus the carbon-containing silicon oxide stacked thereon was not adversely affected. The dielectric constant of the carbon-containing silicon oxide film was lowered to 3.0 thanks to the effect of carbon addition, which was smaller than a dielectric constant of 4.2 for the impurity-free silicon oxide.

Figure 5A:
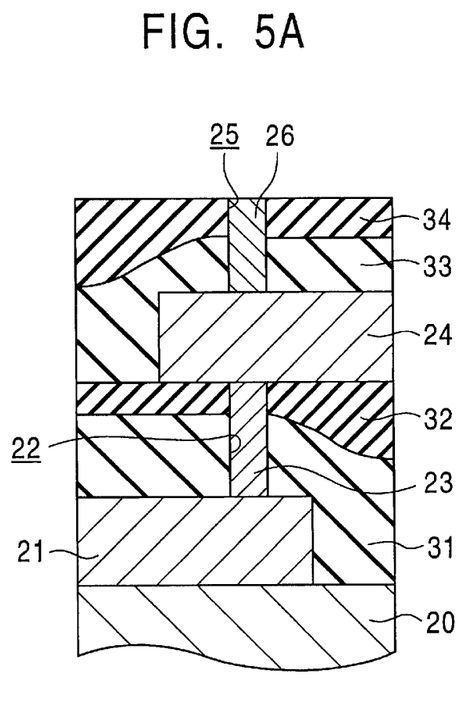
FIGS. 5A and 5B are schematic sectional views showing exemplary embodiments of the semiconductor device of the present invention.
Figure 5B:
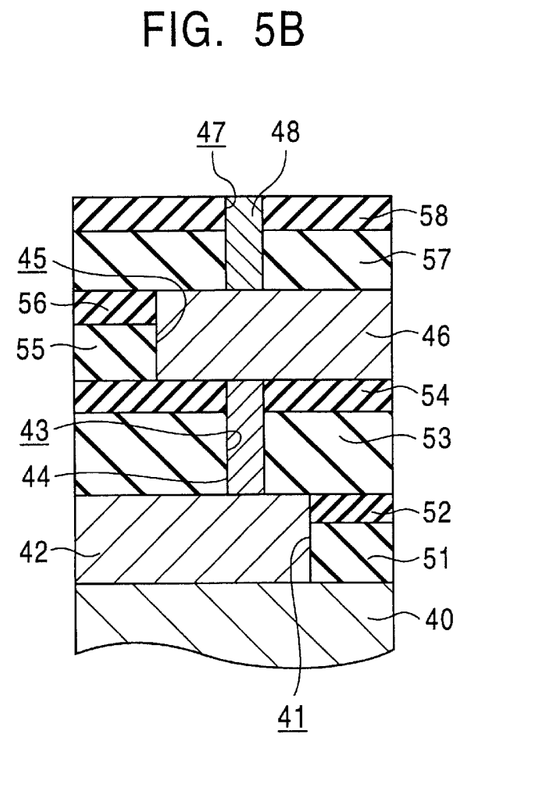

Next, exemplary embodiments of the semiconductor devices of the present invention will be detailed referring to FIGS. 5A and 5B. FIG. 5A shows a constitution of the semiconductor device in which the stacked insulating film 13 was used for a general interlayer insulating film, and FIG. 5B shows a constitution of the semiconductor device having a damascene wiring structure in which the stacked insulating film 13 was used for insulating film between wirings within the same layer or in the separate layers.

As shown in FIG. 5A, a first wiring 21 was formed on a substrate 20, a first organic insulating film 31 is formed so as to cover the first wiring 21, and further thereon a first carbon-containing silicon oxide film 32 is formed. A first contact hole 22 is provided so as to penetrate the first carbon-containing silicon oxide film 32 and the first organic insulating film 31 and so as to reach the first wiring 21, and the first contact hole 22 is filled with a first plug 23 made of tungsten.

On the first carbon-containing silicon oxide film 32 formed is a second wiring 24, which is covered with a second organic insulating film 33, and further thereon a second carbon-containing silicon oxide film 34 is formed. A second contact hole 25 is provided so as to penetrate the second carbon-containing silicon oxide film 34 and the second organic insulating film 33 and so as to reach the second wiring 24, and the second contact hole 25 is filled with a second plug 26 made of tungsten.

In the semiconductor device having the wiring constitution explained referring to FIG. 5A, the interlayer insulating film is composed of the stacked insulating film consisting of the first organic insulating film 31 and the first carbon-containing silicon oxide film 32, and another stacked insulating film consisting of the second organic insulating film 33 and the second carbon-containing silicon oxide film 34, so that the overall dielectric constant of the interlayer insulating film becomes lower than that of the conventional interlayer insulating film having a silicon oxide film free from carbon or other impurities (dielectric constant=4.2).

The silicon oxide film is characterized in that lowering its dielectric constant by containing carbon, so that the above carbon-containing silicon oxide films become lower in the dielectric constant as compared with the silicon oxide film containing no carbon nor other impurities. By controlling the carbon content within a range from 8 atom % to 25 atom %, the carbon-containing silicon oxide films can have a dielectric constant of approx. 2.0 to 3.0, depending on the carbon content. On the other hand, the organic insulating films generally have a dielectric constant of 3.0 or below. Thus an overall effective dielectric constant contributed by such organic insulating films and such carbon-containing silicon oxide films will be 3.0 or below, and thereby a low-k stacked insulating film can be provided. Using such stacked insulating films for isolating wirings in the different layers or within the same layer will successfully reduce the inter-wiring capacitance occurring between the neighboring wirings in separate layers or in the same layer, and will improve performances of semiconductor devices such as avoiding signal transmission delay. The reason why the carbon content is defined as above is similar to that described in the previous paragraph.

The overall dielectric constant of the interlayer insulating film will be suppressed at 3.0 or below also when the carbon-containing silicon oxide films remained on the organic insulating films after being used as an etching mask in the etching of the organic insulating films.

FIG. 5B shows another embodiment, in which a first organic insulating film 51 is formed on a substrate 40, and further thereon a first carbon-containing silicon oxide film 52 is formed. A first groove 41 is provided to the first carbon-containing silicon oxide film 52 and the first organic insulating film 51, and a first wiring 42 is formed so as to fill the first groove 41. On the first carbon-containing silicon oxide film 52, formed are a second organic insulating film 53 covering a first wiring 42; a second carbon-containing silicon oxide film 54; a third organic insulating film 55; and a third carbon-containing silicon oxide film 56 in this order.

A first contact hole 43 is provided so as to penetrate the second carbon-containing silicon oxide film 54 and the second organic insulating film 53, and a first plug 44 is formed so as to fill the first contact hole 43. A second groove 45 is provided to the third carbon-containing silicon oxide film 56 and the third organic insulating film 55, and a second wiring 46 contact with the first plug 44 is formed so as to fill the second groove 45. The first plug 44 and the second wiring 46 now may be formed in an integrated manner.

Further on the third carbon-containing silicon oxide film 56, a fourth organic insulating film 57 and a fourth carbon-containing silicon oxide film 58 are stacked in this order so as to cover the second wiring 46. A second contact hole 47 is provided so as to penetrate the fourth carbon-containing silicon oxide film 58 and the fourth organic insulating film 57 and so as to reach the second wiring 46, and a second plug 48 is formed so as to fill the second contact hole 47.

In the semiconductor device having the wiring constitution explained referring to FIG. 5B, the interlayer insulating film for isolating the wirings in the same layer is composed of the stacked insulating film consisting of the first organic insulating film 51 and the first carbon-containing silicon oxide film 52, or of the third organic insulating film 55 and the third carbon-containing silicon oxide film 56; and the interlayer insulating film for isolating the wirings in the adjacent layers is composed of the second organic insulating film 53 and the second carbon-containing silicon oxide film 54, or of the fourth organic insulating film 57 and the fourth carbon-containing silicon oxide film 58; so that the overall dielectric constant of the interlayer insulating films between wirings within the same layer or in the different layers become lower than that of the conventional interlayer insulating film having a silicon oxide film free from carbon or other impurities (dielectric constant=4.2).

The silicon oxide film is characterized in that lowering its dielectric constant by containing carbon, so that the above carbon-containing silicon oxide films become lower in the dielectric constant as compared with the silicon oxide film containing no carbon nor other impurities. By controlling the carbon content within a range from 8 atom % to 25 atom %, the carbon-containing silicon oxide films can have a dielectric constant of approx. 2.0 to 3.0, depending on the carbon content. On the other hand, the organic insulating films generally have a dielectric constant of 3.0 or below. Thus an overall effective dielectric constant contributed by such organic insulating films and such carbon-containing silicon oxide films will be 3.0 or below, and thereby a low-k stacked insulating film can be provided. Using such stacked insulating films for isolating wirings in the different layers or within the same layer will successfully reduce the inter-wiring capacitance occurring between the neighboring wirings in separate layers or in the same layer, and will improve performances of semiconductor devices such as avoiding signal transmission delay. The reason why the carbon content is defined as above is similar to that described in the previous paragraph.

The overall dielectric constant of the interlayer insulating film will be suppressed at 3.0 or below also when the carbon-containing silicon oxide films remained on the organic insulating films after being used as an etching mask in the etching of the organic insulating films.

Figure 6:
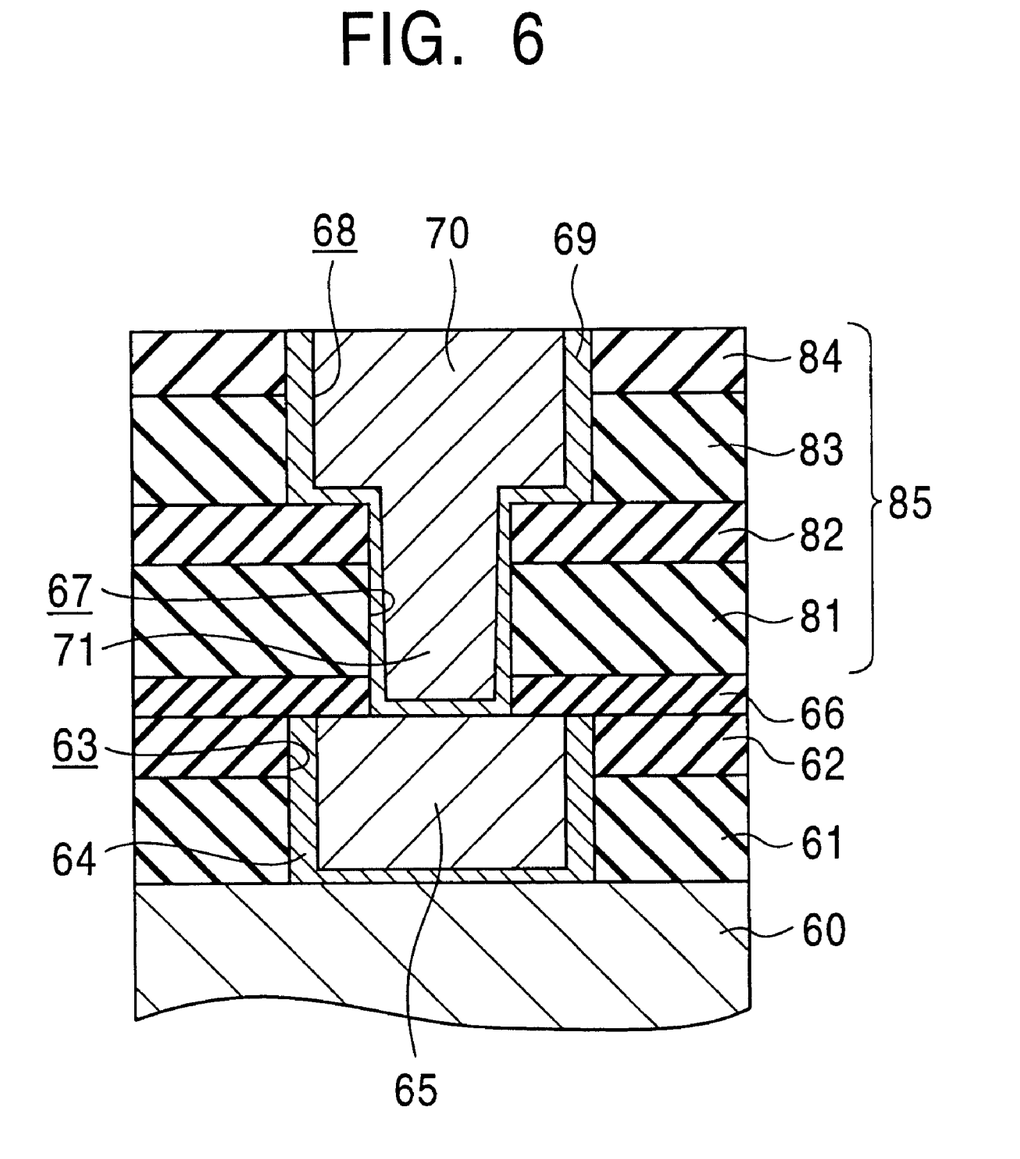
FIG. 6 is a schematic sectional view showing an exemplary embodiment of the method for fabricating the semiconductor device of the present invention.

Next, an exemplary embodiment of the method for fabricating the semiconductor device of the present invention will be detailed referring to FIG. 6. FIG. 6 is a schematic sectional view showing the above stacked insulating film applied to a dual damascene structure.

As shown in FIG. 6, on a substrate 60 having on its surface an insulating film (not shown), an organic insulating film 61 and a silicon oxide film 62 containing no carbon nor other impurities (referred simply as "silicon oxide film" hereinafter) are formed in a stacked manner. A wiring groove 63 is then formed to the silicon oxide film 62 and the organic insulating film 61 according to a known technique. Then as in the usual processes, a barrier metal 64 is formed on the inner surface of the wiring groove 63, and a wiring metal layer is filled, by the plating process or the like, in the wiring groove 63. The unnecessary portions of the metal wiring layer and the barrier metal layer 64 extending over the top surface of the silicon oxide layer 62 are removed by CMP (chemical mechanical polishing), thereby to remain in the wiring groove 63 the wiring metal layer as a first wiring 65 as underlaid with the barrier metal layer 64.

Next, a silicon nitrite film 66 is formed, by the CVD process for example, on the silicon oxide layer 62 so as to cover the first wiring 65.

A first organic insulating film 81, made of polyaryl ether (dielectric constant=2.75) for example, is then formed on the silicon nitrite film 66. And further thereon a first carbon-containing silicon oxide film 82 is formed. The first carbon-containing silicon oxide film 82 formed here has a carbon content of 20 atom % (dielectric constant =2.70), while the preferable range resides in approx. 8 atom % to 25 wt %, and more preferably 10 atom % to 20 atom %.

Next, a resist film (not shown) is formed by a known resist coating technique on the first carbon-containing silicon oxide film 82, and the resist film was then processed by a known photolithographic technique to have an opening (not shown) through which an etching for forming a contact hole for contacting the first wiring 65 will proceed. The first carbon-containing silicon oxide film 82 and the first organic insulating film 81 are then etched using the resist film as an etching mask, thereby to form a contact hole 67.

The resist film plays a role of an etching mask when the first carbon-containing silicon oxide film 82 is etched but is concomitantly etched off when the first organic insulating film 81 begins to be etched, and instead the first carbon-containing silicon oxide film 82 comes into effect as an etching mask from midway. There is no need to perform post-etching removal of the resist film since it is lost during the etching.

Next, a polyaryl ether film (e.g., dielectric constant=2.75), was typically formed as a second organic insulating film 83 on the first carbon-containing silicon oxide film 82 so as to fill the contact hole 67. A second carbon-containing silicon oxide film 84 is then formed on the second organic insulating film 83. The second carbon-containing silicon oxide film 84 formed here has a carbon content of 20 atom % (dielectric constant=2.70), while the preferable range resides in approx. 8 atom % to 25 wt %, and more preferably 10 atom % to 20 atom %. Thus the two sets of the stacked insulating film individually consisting of the organic insulating film and the carbon-containing silicon oxide film were consecutively formed.

Next, a resist film (not shown) is formed by a known resist coating technique on the second carbon-containing silicon oxide film 84, and the resist film was then processed by a known photolithographic technique to have an opening (not shown) through which an etching for forming a wiring groove to reach the contact hole 67 will proceed. The second carbon-containing silicon oxide film 84 and the second organic insulating film 83 are then etched using the resist film as an etching mask, thereby to form a groove 68. The etching was further proceeded to again form the contact hole 67.

The resist film plays a role of an etching mask when the second carbon-containing silicon oxide film 84 is etched but is concomitantly etched off when the second organic insulating film 83 begins to be etched, and instead the second carbon-containing silicon oxide film 84 comes into effect as an etching mask from midway. And when the contact hole 67 is formed again, the first carbon-containing silicon oxide film 82 plays a role of an etching mask. There is no need to perform post-etching removal of the resist film since it is lost during the etching.

Then a barrier metal layer 69 is formed with, for example, tantalum nitrite on the inner surfaces of the contact hole 67 and the wiring groove 68. Further thereon a copper seed layer was deposited by sputtering, and copper was filled in the contact hole 67 and the wiring groove 68 by the electroplating process. Copper will concomitantly deposit on the top surface of the second carbon-containing silicon oxide film 84.

The unnecessary portions of the copper plated layer and the barrier metal layer 69 extending over the top surface of the second carbon-containing silicon oxide film 84 are removed by CMP. In this process, the second carbon-containing silicon oxide film 84 serves as a polishing stopper. Thus a second wiring 70 made of copper is formed in the wiring groove 68 as underlaid with the barrier metal layer 69, and a plug 71 made of copper is formed in the contact hole 67 as underlaid with the barrier metal layer 69.

Next, etching property of the carbon-containing silicon oxide film was investigated.

Using a magnetron etching apparatus, the carbon-containing silicon oxide film was etched under a process condition similar to that in the conventional etching of the silicon oxide film, which involves the etching gas consisting of $C_4F_6$ (in a typical flow rate of 12 sccm), carbonpmonoxide (in a typical flow rate of 150 sccm), and argon (in a typical flow rate of 200 sccm); a source power of 1.60 kW (13.56 MHz); a pressure of 5.3 Pa; and a substrate temperature of 15° C. An observed etching rate was 80 nm/minute, which was found to be lowered, by containing carbon, to one-fifth of the conventional value (400 nm/minute) for the silicon oxide film. This corresponds the etching selectivity of 5, and so-called etching selectivity with regard to the silicon oxide film can be ensured. Although carbon addition tends to reduce etchability, it is advantageous in that facilitating anisotropic etching by retarding the side etching.

A process condition for obtaining a practical etching rate was found out using a similar magnetron etching apparatus, which typically relates to an etching gas consisting of $C_4F_8$ (in a typical flow rate of 7 sccm), argon (in a typical flow rate of 200 sccm) and oxygen (in a typical flow rate of 3 sccm); a source power of 1.60 kW (13.56 MHz); a pressure of 5.3 Pa; and a substrate temperature of 15° C. Such etching condition yielded an etching rate of 350 nm/minute. The carbon-free silicon oxide film yielded an almost equivalent etching rate of 330 nm/minute when etched according to the above conditions. It was, however, found difficult to obtain a desirable anisotropic process shape.

Another process condition for obtaining both a practical etching rate and anisotropic shape was found out using a similar magnetron etching apparatus, which typically relates to an etching gas consisting of $C_4F_8$ (in a typical flow rate of 7 sccm), argon (in a typical flow rate of 100 sccm) and nitrogen (in typical flow rate of 100 sccm); a source power of 1.60 kw (13.56 MHz); a pressure of 5.3 Pa; and a substrate temperature of 15° C. Such etching condition yielded an etching rate of 350 nm/minute and also a desirable anisotropic process shape.

Still another process condition obtained with use of a double-frequency parallel plate plasma etching apparatus typically relates to an etching gas consisting of $C_4F_8$ (in a typically flow rate of 7 sccm), argon (in a typical flow rate of 400 sccm) and oxygen (in a typical flow rate of 10 sccm); a source power of 180 kW (13.56 MHz); an RF bias power of 120 kW; a pressure of 4.0 Pa; and a substrate temperature of 0° C.

Another process condition obtained with use of an electron cyclotron resonance (abbreviated as ECR hereinafter) plasma etching apparatus typically relates to an etching gas consisting of $C_4F_8$ (in a typical flow rate of 5 sccm), argon (in a typical flow rate of 100 sccm) and oxygen (in a typical flow rate of 7 sccm); a source power of 1.50 kW (2.45 GHz); an RF bias power of 900 W; a pressure of 1.0 Pa; and a substrate temperature of 20° C.

The above described conditions are only illustrative and by no means limitative.

According to the foregoing method for fabricating semiconductor devices, the first carbon-containing silicon oxide film 82 serves as an etching mask when the first organic insulating film 81 is etched, and the second carbon-containing silicon oxide film 84 serves as an etching mask when the second organic insulating film 83 is etched, so that both carbon-containing oxide films characteristically remain as parts of the semiconductor devices after the fabrication processes end. The remaining one of the first and second carbon-containing silicon oxide films, however, will not be cause of increase in inter-wiring capacitance within the same layer or in the adjacent layers, since individual component films have a dielectric constant as low as 3.0 or below.

In the foregoing semiconductor device, a unique structural feature resides in that the second wiring 70 is formed on the first carbon-containing silicon oxide film 82 interposed between the first and second organic insulating films 81, 83. The fabrication process of such stacked insulating films complied with that known for the conventional plasma CVD oxide film except that employing the above described process conditions. In such constitution, an interlayer insulating film 85 consists of the first and second organic insulating films 81, 83 and the first and second carbon-containing silicon oxide films 82, 84, all of which individually having a dielectric constant of 2.7 to 2.8, so that an effective dielectric constant of the interlayer insulating film isolating wirings within the same layer or in the adjacent layers will never exceed 3.0. Thus the signal transmission delay can significantly be suppressed.

What is claimed is:

1. A method for forming a stacked insulating film comprising:
    a step of forming on a substrate an organic insulating film, and
    a step of forming by coating on the organic insulating film a carbon-containing silicon oxide film, wherein the carbon-containing silicon oxide film is formed by coating an organic spin-on-glass solution.

2. The method of forming a stacked insulating film as claimed in claim 1, wherein the carbon-containing silicon oxide film is formed so as to attain a carbon content of 8 atom % to 25 atom %.

3. The method for forming a stacked insulating film as claimed in claim 1, wherein said carbon-containing silicon oxide film has a dielectric constant of about 2.0 to about 3.0.

4. A method for forming a stacked insulating film comprising:
    a step of forming on a substrate an organic insulating film, and
    a step of forming by coating on the organic insulating film a carbon-containing silicon oxide film, wherein the carbon-containing silicon oxide film is formed so as to attain a carbon content of 8 atom % to 25 atom %.

5. The method for forming a stacked insulating film as claimed in claim 4, wherein said carbon-containing silicon oxide film has a dielectric constant of about 2.0 to about 3.0.

6. A method for fabricating a semiconductor device comprising:
- a step for forming on a substrate an organic insulating film, and
- a step for forming by coating on the organic insulating film a carbon-containing silicon oxide film, wherein the carbon-containing silicon oxide film is formed by coating an organic spin-on-glass solution.

7. The method for forming a stacked insulating film as claimed in claim 6, wherein said carbon-containing silicon oxide film has a dielectric constant of about 2.0 to about 3.0.

8. A method for fabricating a semiconductor device comprising:
- a step for forming on a substrate an organic insulating film, and
- a step for forming by coating on the organic insulating film a carbon-containing silicon oxide film, wherein the carbon-containing silicon oxide film is formed so as to attain a carbon content of 8 atom % to 25 atom %.

9. The method for forming a stacked insulating film as claimed in claim 8, wherein said carbon-containing silicon oxide film has a dielectric constant of about 2.0 to about 3.0.

10. In a semiconductor device having an insulating film, said insulating film having at least a part thereof a stacked insulating film, said stacked insulating film comprising:
- an organic insulating film, and a carbon-containing silicon oxide film formed on the organic insulating film, wherein the carbon-containing silicon oxide film has a carbon content of 8 atom % to 25 atom %.

11. The semiconductor device as claimed in claim 10, wherein the carbon-containing silicon oxide film has a dielectric constant of about 2.0 to about 3.0.

* * * * *